(12) United States Patent
Demidov et al.

(10) Patent No.: US 9,305,041 B2
(45) Date of Patent: Apr. 5, 2016

(54) COMPRESSION OF SERIALIZED B-TREE DATA

(71) Applicant: INTERNATIONAL BUSINESS MACHINES CORPORATION, Armonk, NY (US)

(72) Inventors: Lilia Demidov, Ness-Tziona (IL); Nir Halowani, Holon (IL); Yifat Kuttner, Tel Aviv (IL); Ben Sasson, Yaffo (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 215 days.

(21) Appl. No.: 14/147,999

(22) Filed: Jan. 6, 2014

(65) Prior Publication Data

US 2015/0193488 A1    Jul. 9, 2015

(51) Int. Cl.
*G06F 17/30*    (2006.01)
(52) U.S. Cl.
CPC .... *G06F 17/30327* (2013.01); *G06F 17/30595* (2013.01)

(58) Field of Classification Search
CPC ................................................ G06F 17/30595
See application file for complete search history.

(56) References Cited

U.S. PATENT DOCUMENTS

| 7,647,291 B2 | 1/2010 | Mosescu |
| 2007/0109153 A1* | 5/2007 | Ma ....................... H03M 7/3086 341/50 |
| 2010/0281013 A1* | 11/2010 | Graefe .............. G06F 17/30327 707/715 |
| 2012/0119927 A1 | 5/2012 | Zhang et al. |
| 2013/0110766 A1 | 5/2013 | Promhouse et al. |

OTHER PUBLICATIONS

Amur et al. "Memory-Efficient GroupBy-Aggregate using Compressed Buffer Trees", ACM Oct. 1, 2013.*

* cited by examiner

*Primary Examiner* — Etienne Leroux
*Assistant Examiner* — Cindy Nguyen
(74) *Attorney, Agent, or Firm* — Griffiths & Seaton PLLC

(57) ABSTRACT

B-Tree data is serialized to existing data for all types of workloads. The serialized B-Tree data, that has been split, sorted and classified into identified data ranges, is then compressed.

17 Claims, 9 Drawing Sheets

800

ORIGINAL BUFFER RANGE: 17 19 24 24 24 21 15 10 89 95 96 96 96 95 94 94 95 93 90 87 86 86 ...

FREQUENCY ENCODED BUFFER: 17 2 5 0 0 -3 -6 -5 79 6 1 0 0 -1 -1 0 1 -2 -3 -3 -1 0 ...

FIG. 8

USUS 9,305,041 B2

COMPRESSION OF SERIALIZED B-TREE DATA

BACKGROUND OF THE INVENTION

1. Field of the Invention

The present invention relates in general to computers, and more particularly to compression of serialized B-Tree data in a computing environment.

2. Description of the Related Art

In today's society, computer systems are commonplace. Computer systems may be found in the workplace, at home, or at school. Computer systems may include data storage systems, or disk storage systems, to process and store data. Large amounts of data have to be processed daily and the current trend suggests that these amounts will continue being ever-increasing in the foreseeable future. Computers are very powerful tools for storing and providing access to vast amounts of information. Computer databases are a common mechanism for storing information on computer systems while providing easy access to users. Databases are computerized information storage and retrieval systems. A database management system or DBMS is typically provided as a software cushion or layer. In essence, the DBMS shields the database user from knowing or even caring about underlying hardware-level details. However, a need exists for increased computing efficiency for storing, accessing, and retrieving of data contained in a data structure within the computing database.

SUMMARY OF THE DESCRIBED EMBODIMENTS

In one embodiment, a method is provided for compression of serialized B-Tree data using a processor device in a computing environment. In one embodiment, by way of example only, the method compresses B-Tree data that has been split, sorted and classified into identified data ranges.

In another embodiment, a computer system is provided for compression of serialized B-Tree data using a processor device, in a computing environment. The computer system includes a computer-readable medium and a processor in operable communication with the computer-readable medium. In one embodiment, by way of example only, the processor compresses B-Tree data that has been split, sorted and classified into identified data ranges.

In a further embodiment, a computer program product is provided for compression of serialized B-Tree data using a processor device, in a computing environment. The computer-readable storage medium has computer-readable program code portions stored thereon. The computer-readable program code portions include a first executable portion that compresses B-Tree data that has been split, sorted and classified into identified data ranges.

In addition to the foregoing exemplary method embodiment, other exemplary system and computer product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which:

FIG. 8 is a block diagram illustrating exemplary encoding of each identified data range with frequency encoding in which aspects of the present invention may be realized;

DETAILED DESCRIPTION OF THE DRAWINGS

Figure 1:
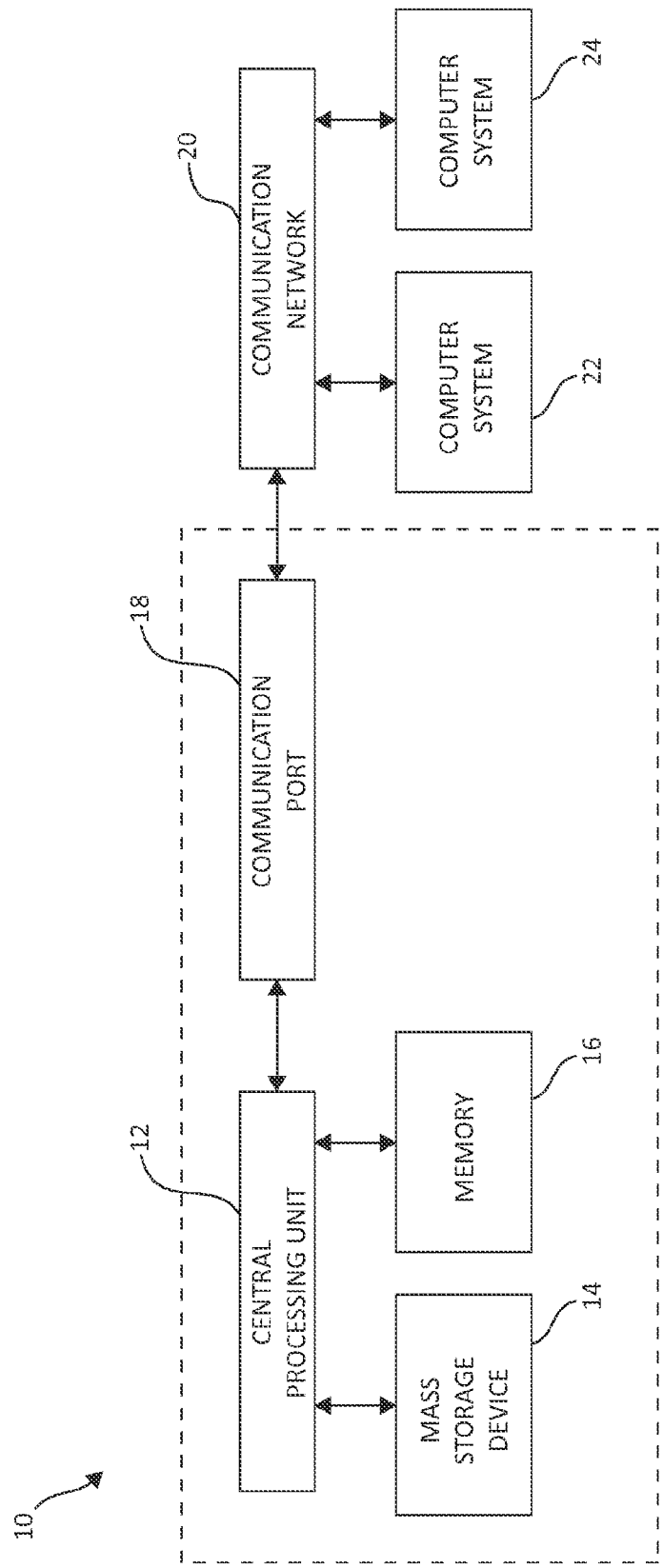
FIG. 1 is a block diagram illustrating a computing system environment having an example storage device in which aspects of the present invention may be realized.

In one embodiment, a Relational Database Management System (RDBMS) is a database management system (DBMS) which uses relational techniques for storing and retrieving data in one embodiment, a database is an organized collection of related information stored as "records" having "fields" of information. As an example, a database of employees may have a record for each employee where each record contains fields designating specifics about the employee, such as name, home address, salary, and the like. Between the actual physical database itself (i.e., the data actually stored on a storage device) and the users of the system, a database management system or DBMS is typically provided as a software cushion or layer. Data transaction processing is done using a RDBMS. Since the inclusion of RDBMSs in business, user-defined data types and user-defined functions have been brought into RDBMSs to enrich the data modeling and data processing power. User-defined data based on the user-defined data types may include audio, video, image, text, spatial data (e.g., shape, point, line, polygon, etc.), time series data, OLE documents, Java objects, C++ objects, etc.

In one embodiment, a table in a database can be accessed using an index. An index is an ordered set of references (e.g., pointers) to the records or rows in a database file or table.

Indexes are data structures used to process queries by providing relatively fast access to a set of data based on key values. Database systems historically have included one or two index types to enable database users to improve query-processing performance. The index may be used to access each record in the file using a key (i.e., one of the fields of the record or attributes of the row). Without an index, finding a record would require a scan (e.g., linearly) of an entire table. Indexes provide an alternate technique to accessing data in a table. Users can create indexes on a table after the table is built. An index is based on one or more columns of the table. A B-tree is a binary tree that may be used to store the references to the records in a table.

In one embodiment, a data storage structure provides for a B-tree data structure, used to quickly locate specific units of data (such as data records in a database or files in a directory) stored on a secondary storage device. In one embodiment, a B-tree index is provided. A B-tree provides a means of clustering pointers to units of data, so that the units can be quickly located. A B-tree index has branch nodes and leaf nodes. The branch nodes contain pointers to other nodes and data that indicate the range of values associated with the nodes to which they point. The leaf nodes store the index entries. For example, each index entry includes a key, rowid! pair, where "key" is a particular key value and "rowid" is a row identifier that points to a particular row of a data table that contains that particular key value. When a B-tree is used to process a query, the output of the B-tree index is a sequence of rowids.

However, random access to the data involves high central processing unit (CPU) utilizations. Workloads that suffer from high CPU and poor latency, because for each user's read request we need to read the compressed block, decompress it and then copy the users requested data. For example, assume a user/application wants to read data that is written to storage. The actions performed are: 1) lookup in Index-Map to find which block holds the compressed data, 2) read the block from disk, and 3) retrieve the requested data and return it to the user/app. In one embodiment, the Index B-Tree Storage provides for an efficient ordered key-value map, which means that the B-tree index may quickly find a record given the key, and it can be scanned in order. It also makes easy to fetch all keys (and records) within a range: "all events between 9 am and 5 pm", "last names starting with 'R'". In one embodiment, the Index B-Tree storage systems every segment keeps a log for each input/output (IO)-write to the segment. At any point in time, the segment memory map may be recreated by reading all the logs and 'replaying' them. All the logs are saved on B-Trees Index Blocks.

While a segment is opened and loaded, it manages all the logs and all the blocks information. When a segment is closed all the logs are saved to index blocks, and the B-Trees are cleared. When a segment is loaded, the system reads all the logs from a disc, and recreates the B-Trees. Building the trees is a time-consuming action, reducing the performance, particularly when system loads many segment all the time. Furthermore, serialization and the process of converting the data structure require significantly bigger representation of data and more storage space for storing them. Thus, the present invention provides a new algorithm for efficient serialization of B-Tree data to existing data on any type of workload.

In one embodiment, a new algorithm is provided for B-Tree serialization by converting the data structure into a format that can be stored and resurrected later. The serialization process refers to the scenario in which a segment is closed and all the logs are saved to index blocks, and the B-Trees representing the index blocks are cleared. When a segment is loaded, the system reads all the logs from a disc, and recreates the B-Trees. Storing a serialized B-Tree suggest actually replacing the logs with serialization of the B-Trees. This will allow to skip rebuilding of the B-trees each time a segment is loaded, and decrease the time needed. The Serialization data will contain all the data stored in the data structure and more information about the data structure itself. The output of a serialize process can be one or more binary buffers.

In one embodiment, serialization is the process of converting a data structure into a format that can be stored and resurrected later. The Serialization data contains all the data stored in the data structure and more information about the data structure itself. The B-Tree serialization data will contain all the data stored in the data structure and more information about the data structure itself.

Also, in one embodiment, data compression is used as an efficient way to save space on a storage system. However, data compression creates challenges to perform the random access operations due to the unpredicted compressed output. A compressed object is written to disk in a log-structured (journal) format. Data is compressed in the order it is written by the user/application (time-based-compression/temporal locality). However, as mentioned, random access to the data involves high central processing unit (CPU) utilizations. These workloads suffer from high CPU and poor latency because for each user's read request it is required to read the compressed block, decompress it and then copy the users requested data. For example, assume a user/application wants to read data that is written in W2. The actions performed are: 1) lookup in Index-Map to find which block holds the compressed data, 2) read the block from disk, 3) decompress the block's data, and 4) retrieve the requested data and return it to the user/app. Thus, in one embodiment, the present invention provides for compression of serialized B-Tree data for efficient compression of serialized B-Tree data to existing data on any type of workload using a processor device in a computing environment. In one embodiment, by way of example only, the method compresses B-Tree data that has been split, sorted and classified into identified data ranges.

In one embodiment, the present invention compresses serialized B-Tree data using a processor device in a computing environment. In one embodiment, by way of example only, the method compresses B-Tree data that has been split, sorted and classified into identified data ranges.

Turning now to FIG. 1, exemplary architecture 10 of a computing system environment is depicted. The computer system 10 includes central processing unit (CPU) 12, which is connected to communication port 18 and memory device 16. The communication port 18 is in communication with a communication network 20. The communication network 20 and storage network may be configured to be in communication with server (hosts) 24 and storage systems, which may include storage devices 14. The storage systems may include hard disk drive (HDD) devices, solid-state devices (SSD) etc., which may be configured in a redundant array of independent disks (RAID). The operations as described below may be executed on storage device(s) 14, located in system 10 or elsewhere and may have multiple memory devices 16 working independently and/or in conjunction with other CPU devices 12. Memory device 16 may include such memory as electrically erasable programmable read only memory (EEPROM) or a host of related devices. Memory device 16 and storage devices 14 are connected to CPU 12 via a signal-bearing medium. In addition, CPU 12 is connected through communication port 18 to a communication network 20, having an attached plurality of additional computer host systems 24. In addition, memory device 16 and the CPU 12 may be embedded and included in each component of the computing system 10. Each storage system may also include separate and/or distinct memory devices 16 and CPU 12 that work in conjunction or as a separate memory device 16 and/or CPU 12.

Figure 2:
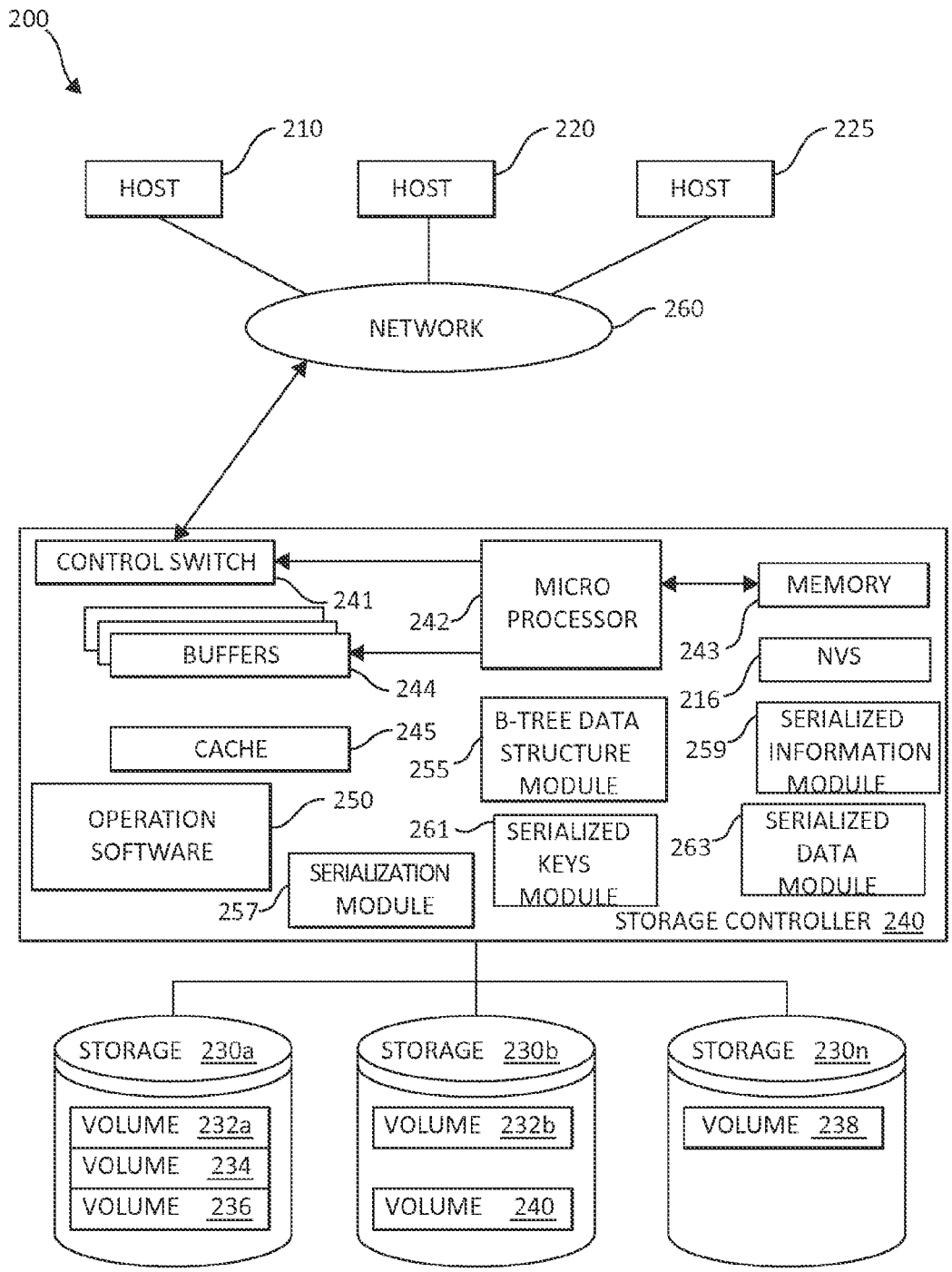
FIG. 2 is a block diagram illustrating a hardware structure of data storage system in a computer system in which aspects of the present invention may be realized.

FIG. 2 is an exemplary block diagram 200 showing a hardware structure of a data storage system in a computer system according to the present invention. Host computers 210, 220, 225, are shown, each acting as a central processing unit for performing data processing as part of a data storage system 200. The cluster hosts/nodes (physical or virtual devices), 210, 220, and 225 may be one or more new physical devices or logical devices to accomplish the purposes of the present invention in the data storage system 200. In one embodiment, by way of example only, a data storage system 200 may be implemented as IBM® ProtecTIER® deduplication system TS7650G™. A Network connection 260 may be a fibre channel fabric, a fibre channel point to point link, a fibre channel over ethernet fabric or point to point link, a FICON or ESCON I/O interface, any other I/O interface type, a wireless network, a wired network, a LAN, a WAN, heterogeneous, homogeneous, public (i.e. the Internet), private, or any combination thereof. The hosts, 210, 220, and 225 may be local or distributed among one more locations and may be equipped with any type of fabric (or fabric channel) (not shown in FIG. 2) or network adapter 260 to the storage controller 240, such as Fibre channel, FICON, ESCON, Ethernet, fiber optic, wireless, or coaxial adapters. Data storage system 200 is accordingly equipped with a suitable fabric (not shown in FIG. 2) or network adaptor 260 to communicate. Data storage system 200 is depicted in FIG. 2 comprising storage controllers 240 and cluster hosts 210, 220, and 225. The cluster hosts 210, 220, and 225 may include cluster nodes.

To facilitate a clearer understanding of the methods described herein, storage controller 240 is shown in FIG. 2 as a single processing unit, including a microprocessor 242, system memory 243 and nonvolatile storage ("NVS") 216. It is noted that in some embodiments, storage controller 240 is comprised of multiple processing units, each with their own processor complex and system memory, and interconnected by a dedicated network within data storage system 200. Storage 230 (labeled as 230a, 230b, and 230n in FIG. 3) may be comprised of one or more storage devices, such as storage arrays, which are connected to storage controller 240 (by a storage network) with one or more cluster hosts 210, 220, and 225 connected to each storage controller 240.

In some embodiments, the devices included in storage 230 may be connected in a loop architecture. Storage controller 240 manages storage 230 and facilitates the processing of write and read requests intended for storage 230. The system memory 243 of storage controller 240 stores program instructions and data, which the processor 242 may access for executing functions and method steps of the present invention for executing and managing storage 230 as described herein. In one embodiment, system memory 243 includes, is in association with, or is in communication with the operation software 250 for performing methods and operations described herein. As shown in FIG. 2, system memory 243 may also include or be in communication with a cache 245 for storage 230, also referred to herein as a "cache memory", for buffering "write data" and "read data", which respectively refer to write/read requests and their associated data. In one embodiment, cache 245 is allocated in a device external to system memory 243, yet remains accessible by microprocessor 242 and may serve to provide additional security against data loss, in addition to carrying out the operations as described herein.

In some embodiments, cache 245 is implemented with a volatile memory and nonvolatile memory and coupled to microprocessor 242 via a local bus (not shown in FIG. 2) for enhanced performance of data storage system 200. The NVS 216 included in data storage controller is accessible by microprocessor 242 and serves to provide additional support for operations and execution of the present invention as described in other figures. The NVS 216, may also referred to as a "persistent" cache, or "cache memory" and is implemented with nonvolatile memory that may or may not utilize external power to retain data stored therein. The NVS may be stored in and with the cache 245 for any purposes suited to accomplish the objectives of the present invention. In some embodiments, a backup power source (not shown in FIG. 2), such as a battery, supplies NVS 216 with sufficient power to retain the data stored therein in case of power loss to data storage system 200. In certain embodiments, the capacity of NVS 216 is less than or equal to the total capacity of cache 245.

Storage 230 may be physically comprised of one or more storage devices, such as storage arrays. A storage array is a logical grouping of individual storage devices, such as a hard disk. In certain embodiments, storage 230 is comprised of a JBOD (Just a Bunch of Disks) array or a RAID (Redundant Array of Independent Disks) array. A collection of physical storage arrays may be further combined to form a rank, which dissociates the physical storage from the logical configuration. The storage space in a rank may be allocated into logical volumes, which define the storage location specified in a write/read request.

In one embodiment, by way of example only, the storage system as shown in FIG. 2 may include a logical volume, or simply "volume," may have different kinds of allocations. Storage 230a, 230b and 230n are shown as ranks in data storage system 200, and are referred to herein as rank 230a, 230b and 230n. Ranks may be local to data storage system 200, or may be located at a physically remote location. In other words, a local storage controller may connect with a remote storage controller and manage storage at the remote location. Rank 230a is shown configured with two entire volumes, 234 and 236, as well as one partial volume 232a. Rank 230b is shown with another partial volume 232b. Thus volume 232 is allocated across ranks 230a and 230b. Rank 230n is shown as being fully allocated to volume 238—that is, rank 230n refers to the entire physical storage for volume 238. From the above examples, it will be appreciated that a rank may be configured to include one or more partial and/or entire volumes. Volumes and ranks may further be divided into so-called "tracks," which represent a fixed block of storage. A track is therefore associated with a given volume and may be given a given rank.

The storage controller 240 may include a B-Tree Data structure module 255, a serialization module 257, a serialized information module 259, a serialized keys module 261, and a serialized data module 263. The B-Tree Data structure module 255, a serialization module 257, the serialized information module 259, the serialized keys module 261, and the serialized data module 263 may work in conjunction with each and every component of the storage controller 240, the hosts 210, 220, 225, and storage devices 230. The B-Tree Data structure module 255, a serialization module 257, the serialized information module 259, the serialized keys module 261, and the serialized data module 263 may be structurally one complete module or may be associated and/or included with other individual modules. The B-Tree Data structure module 255, a serialization module 257, the serialized information module 259, the serialized keys module 261, and the serialized data module 263 may also be located in the cache 245 or other components.

The storage controller 240 includes a control switch 241 for controlling the fiber channel protocol to the host computers 210, 220, 225, a microprocessor 242 for controlling all the storage controller 240, a nonvolatile control memory 243 for storing a microprogram (operation software) 250 for controlling the operation of storage controller 240, data for control, cache 245 for temporarily storing (buffering) data, and buffers 244 for assisting the cache 245 to read and write data, a control switch 241 for controlling a protocol to control data transfer to or from the storage devices 230, the data duplication module 255, the similarity index module 257, and the similarity search module 259, in which information may be set. Multiple buffers 244 may be implemented with the present invention to assist with the operations as described herein. In one embodiment, the cluster hosts/nodes, 210, 220, 225 and the storage controller 240 are connected through a network adaptor (this could be a fibre channel) 260 as an interface i.e., via at least one switch called "fabric."

In one embodiment, the host computers or one or more physical or virtual devices, 210, 220, 225 and the storage controller 240 are connected through a network (this could be a fibre channel) 260 as an interface i.e., via at least one switch called "fabric." In one embodiment, the operation of the system shown in FIG. 2 will be described. The microprocessor 242 may control the memory 243 to store command information from the host device (physical or virtual) 210 and information for identifying the host device (physical or virtual) 210. The control switch 241, the buffers 244, the cache 245, the operating software 250, the microprocessor 242, memory 243, NVS 216, B-Tree Data structure module 255, a serialization module 257, the serialized information module 259, the serialized keys module 261, and the serialized data module 263 are in communication with each other and may be separate or one individual component(s). Also, several, if not all of the components, such as the operation software 250 may be included with the memory 243. Each of the components within the devices shown may be linked together and may be in communication with each other for purposes suited to the present invention. As mentioned above, the B-Tree Data structure module 255, a serialization module 257, the serialized information module 259, the serialized keys module 261, and the serialized data module 263 may also be located in the cache 245 or other components. As such, the B-Tree Data structure module 255, a serialization module 257, the serialized information module 259, the serialized keys module 261, and the serialized data module 263 maybe used as needed, based upon the storage architecture and users preferences.

Figure 3:
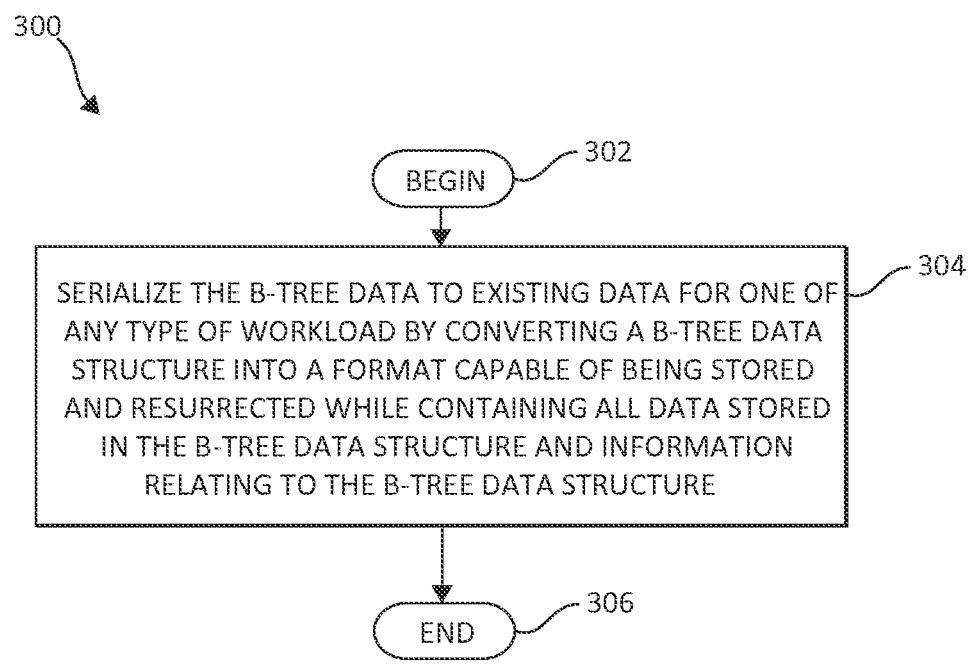
FIG. 3 is a flowchart illustrating an exemplary method for efficient B-Tree data serialization in a computing environment in which aspects of the present invention may be realized.

FIG. 3 is a flowchart illustrating an exemplary method 300 for efficient B-Tree data serialization in a computing environment in which aspects of the present invention may be realized. The method 300 begins (step 302). The method 300 serializes the B-Tree data to existing data for one of any type of workload by converting a B-Tree data structure into a format capable of being stored and resurrected while containing all data stored in the B-Tree data structure and information relating to the B-Tree data structure (step 304). The method 300 ends (step 306).

As mentioned above, in one embodiment, the B-Tree data structure is a tree data structure where each node contains a sorted list of elements. In one embodiment, elements in the B-Tree data structure are sorted according to a specific Key. An inner node contains keys, while leaf nodes contain keys and data. One of the B-Tree data structure characteristics is the maximum number of keys per inner node, and per leaf node. Leaf nodes are also connected as a linked list.

In one embodiment, the B-Tree data structure contains the inner nodes, the leaf nodes, and B-Tree additional characteristics. For the Inner node, in one embodiment the inner nodes include a level, which is the index of B-Tree level for a particular node. In one embodiment, each level is great than zero (e.g., Level>0). Also, each inner node uses a slot (slot used), which is the number of slots occupied for a particular node. Also, the inner nodes include keys, which include a list of keys for a particular node. Each inner node may also include children (childs), which is a list of references to child nodes.

For the leaf node, in one embodiment the inner nodes include a level, which is the index of B-Tree level for a particular node. In one embodiment, each level is equal zero (e.g., Level=0). Also, each leaf node uses a slot (e.g., "slot used"), which is the number of slots occupied for a particular node. Also, the leaf nodes include keys, which include a list of keys for a particular node. Each leaf node may also include data, which is a list of data elements for a particular node. Also, the leaf node includes and/or references a previous leaf, which is a reference to previous leaf in tree, and also includes and/or references a next leaf, which is a reference to next leaf in tree.

In one embodiment, the B-Tree data structure contains B-Tree additional characteristics. The additional characteristics include at least one of a maximum number of slots in an inner node, a maximum number of slots in a leaf node, a total number of leafs, a total number of inner nodes, and a total number of elements stored in tree.

Serialization Output

Figure 4:
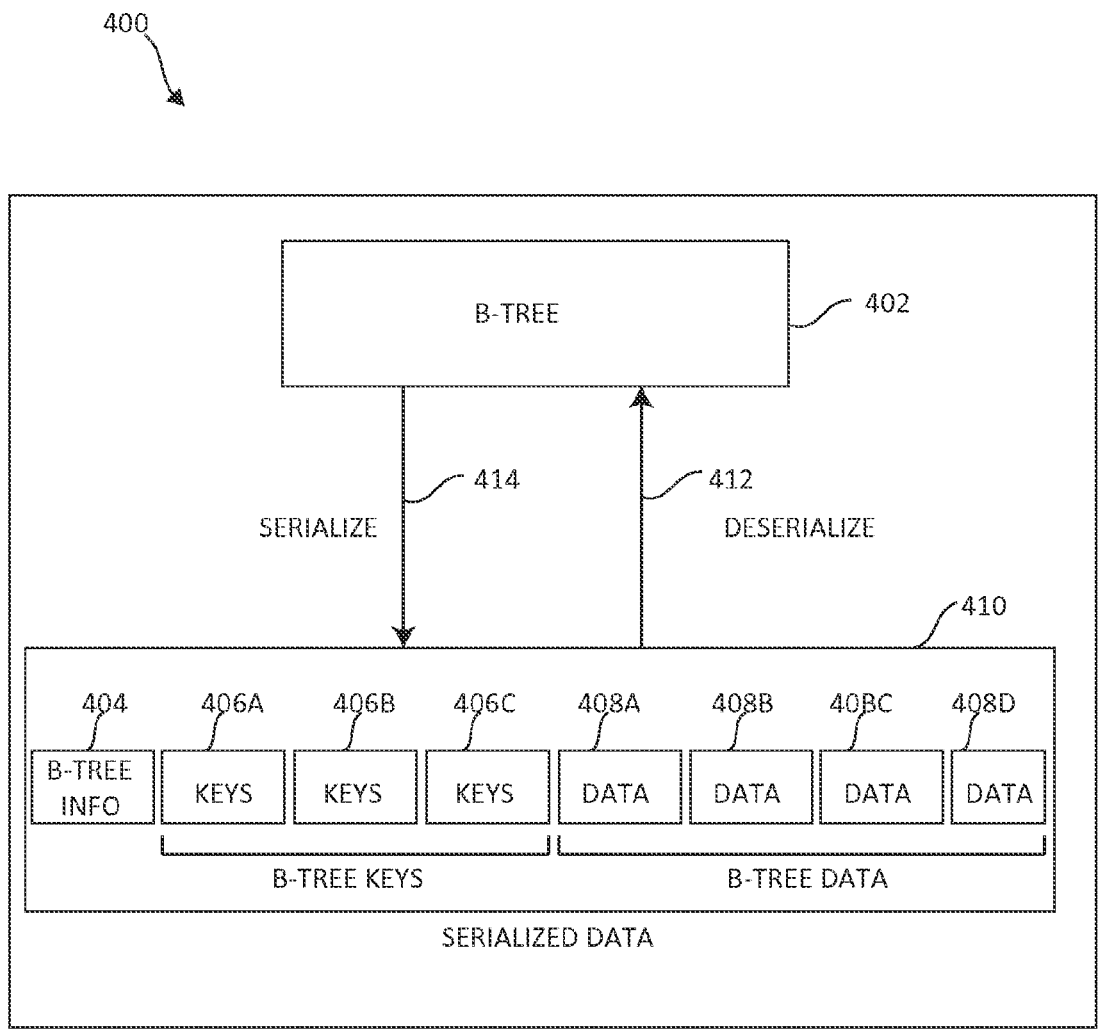
FIG. 4 is a block diagram illustrating an exemplary B-Tree data serialization and deserialization in which aspects of the present invention may be realized.

Turning now to FIG. 4, is a FIG. 4 is a block diagram 400 illustrating an exemplary B-Tree data serialization and deserialization in which aspects of the present invention may be realized. As illustrated, FIG. 4 contains a B-Tree data structure 402. The serialized data is divided into three sections (404, 406, and 408): The B-tree information section 404 represents all the information about the B-Tree structure, other then the actual keys and data. The B-tree information section 404 will also contains information about the serialization itself such as the number of buffers used for serialization. The B-tree Keys section 406 (shown as 406A-C) contains all the keys of the tree. The B-tree data section 408 (shown as 408A-D) contains the data elements stored in the tree.

In one embodiment, the serialized data 410 is stored in an ordered set of binary buffers. The first binary buffer will always contain the entire B-tree information section 404. Next buffers will contain keys (stored in B-tree Keys section 406) and then data (stored in the B-tree data section 408). The Keys and data may take a large space, and may be divided into smaller buffers to keep system limitation of maximum buffer size. FIG. 4 illustrates the data being serialized 414 from the B-Tree data structure 402 and becoming the serialized data 410 and then deserialized 412 from the serialized data 410 back into the B-Tree data structure 402.

Following is a description of the data being serialized into each of the B-Tree sections (e.g., the B-tree information section 404, the B-tree Keys section 406, and the B-tree data section 408).

Serialized Information Section

In one embodiment, when storing the data into the B-tree data section 408, the first data to save is the information describing the B-tree itself. This information describes the sizes and amounts of elements in B-tree. When deserializing, this information will be used to calculate memory required for the tree.

The B-tree serialized information contains a header, the version, the level information, the node information, and the information section size. The header describes tree content and sizes. The header also includes the number of serialized buffers (e.g., total number of serialized buffers used for the particular B-tree and includes the info buffer. The header also includes a levels count, which is the number of levels in tree including the leaves level. The header also includes a leaves count, which is the number of leaves in tree. The header also includes an inner nodes count, which number of inner nodes in tree. An items count is also included in the header, which is the number of elements stored in tree. The header also includes a Keys buffer size, which is the size in bytes of serialized keys.

The B-tree serialized information contains the version, which describes tree structure. The version includes a Key type size, which is the size in bytes for each key in tree; a data type size, which is the size in bytes for each data element in tree; a leaf slot max count, which is the maximum allowed slots in leaf; and also an inner slot max count, which is the maximum allowed slots in inner node.

In addition to the B-tree information, a record is kept and maintained for each level in B-tree, and for each node in the B-tree. The B-tree serialized information contains the level information. The level information includes a nodes count, which is the number of nodes (inner nodes or leaves in level); and a Keys count, which is a total number of keys stored in level.

The B-tree serialized information contains the node information. The node information includes a Keys count, which is the number of keys in node (in case of leaf node, this is also the number of data elements in leaf). The B-tree serialized information includes the B-tree serialized information section size which is equal to size of structure describing tree information plus the size of structure describing each tree level, which is then multiplied by the number of levels in tree (e.g., size of structure describing tree information+size of structure describing each tree level*number of levels in tree).
Serialized Keys Section In one embodiment, the buffer that stores the information of the B-tree Keys section, will contain the keys used in a tree, with the order of the keys (e.g., the keys order) being ordered according to tree scan order. The size of the B-tree Keys section is equal to the number of keys saved in inner nodes+ number of keys saved in leaves). The product is then multiplied by the size of the key (e.g., the size of the keys refers to the number of bytes required to represent one key value, for example 4 Bytes. Size=(number of keys saved in inner nodes+number of keys saved in leaves)*(size of key)).
Serialized Data Section In one embodiment, the buffer, which stores the information of B-tree data section, contains the data elements stored in tree. The size of the B-tree data section is equal to a number of elements in tree multiplied by the size of element (e.g., size=number of elements in tree*size of element).

Figure 5:
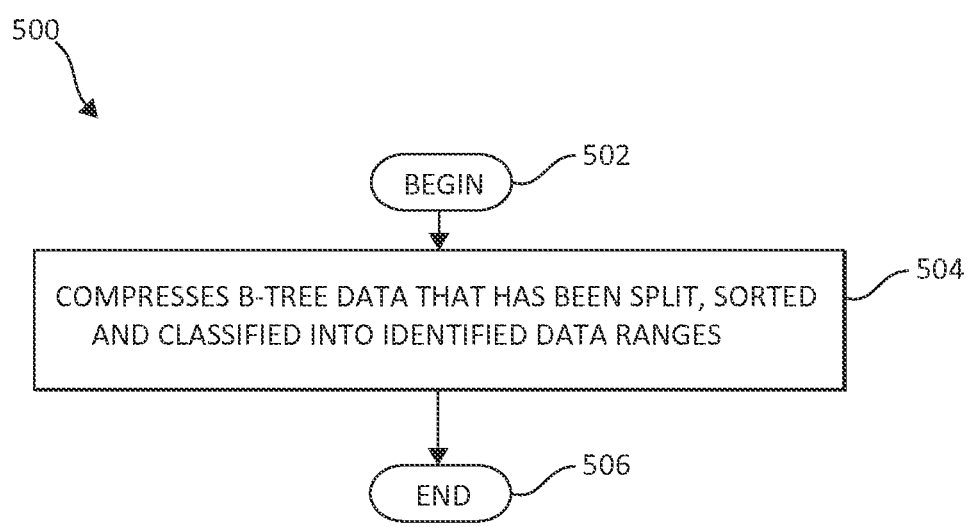
FIG. 5 is a flowchart illustrating an exemplary method for efficient compression of serialized B-Tree data in a computing environment in which aspects of the present invention may be realized is illustrated.

Turning now to FIG. 5, a flowchart illustrating an exemplary method 500 for efficient compression of serialized B-Tree data in a computing environment in which aspects of the present invention may be realized is illustrated. The method 500 begins (step 502). The method 500 compresses B-Tree data that has been split, sorted and classified into identified data ranges (step 504). The method 500 ends.

Figure 6:
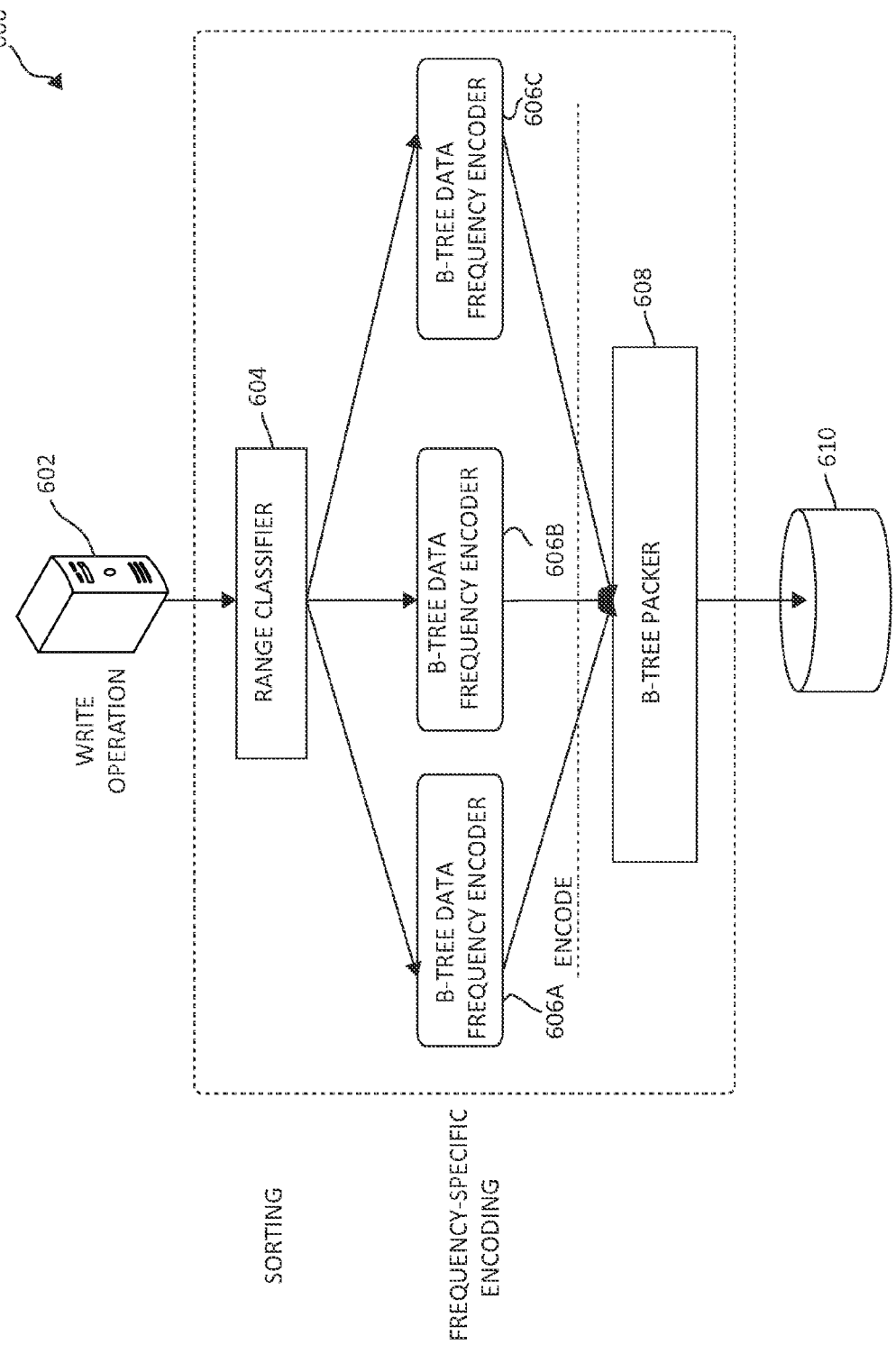
FIG. 6 is a block diagram illustrating exemplary classification of serialized B-Tree data in which aspects of the present invention may be realized.

FIG. 6 is a block diagram 600 illustrating exemplary classification of serialized B-Tree data in which aspects of the present invention may be realized. In one embodiment, the present invention classifies a current symbol based on its causal neighbors (contexts) to exploit the spatial dependency within the data stream. So the present invention looks at different orderings until the most appropriate context order is located (e.g., for example, 4 bytes is the best order of context for a given data range). As such, the block diagram 600 illustrates incoming data 602 (e.g., a I/O operation such as a write operation) is sent to a range classifier 604. The range classifier 604 groups together serialized B-tree data of a similar data frequency (e.g., 606A, 606B, and/or 606C) via a frequency encoder (e.g., groups serialized B-tree data of similar frequency in the same compression stream by classifying the serialized B-tree data). As illustrated in FIG. 6, the classifications 606 may be classified and sorted according to similar data frequency (e.g., 606A, 606B, and/or 606C), and then sorted into these classes (e.g., serialized B-tree data encoded frequency) 606 accordingly. The classifying may be performed in a single pass and is not limited to a rigid format. The classification-based compression supports both fixed and variable data lengths (e.g., JASON, XML, etc.) and compresses data across the columns. Since standard compression operations do not compress short tokens efficiently, the classification uses small dictionaries to assist with short token compression. For each class 606, the mechanisms apply a frequency-specific optimized encoding operation and then combine all compressed frequency-specific encoding methods into one B-Tree packer (e.g., an output buffer_for real-time compression 608. It should be noted that a variety of compression operations may be applied to each of the serialized B-tree data streams for generating an increased compression ratio. The data may then be extracted and stored in a varied of storage components 610.

Figure 7:
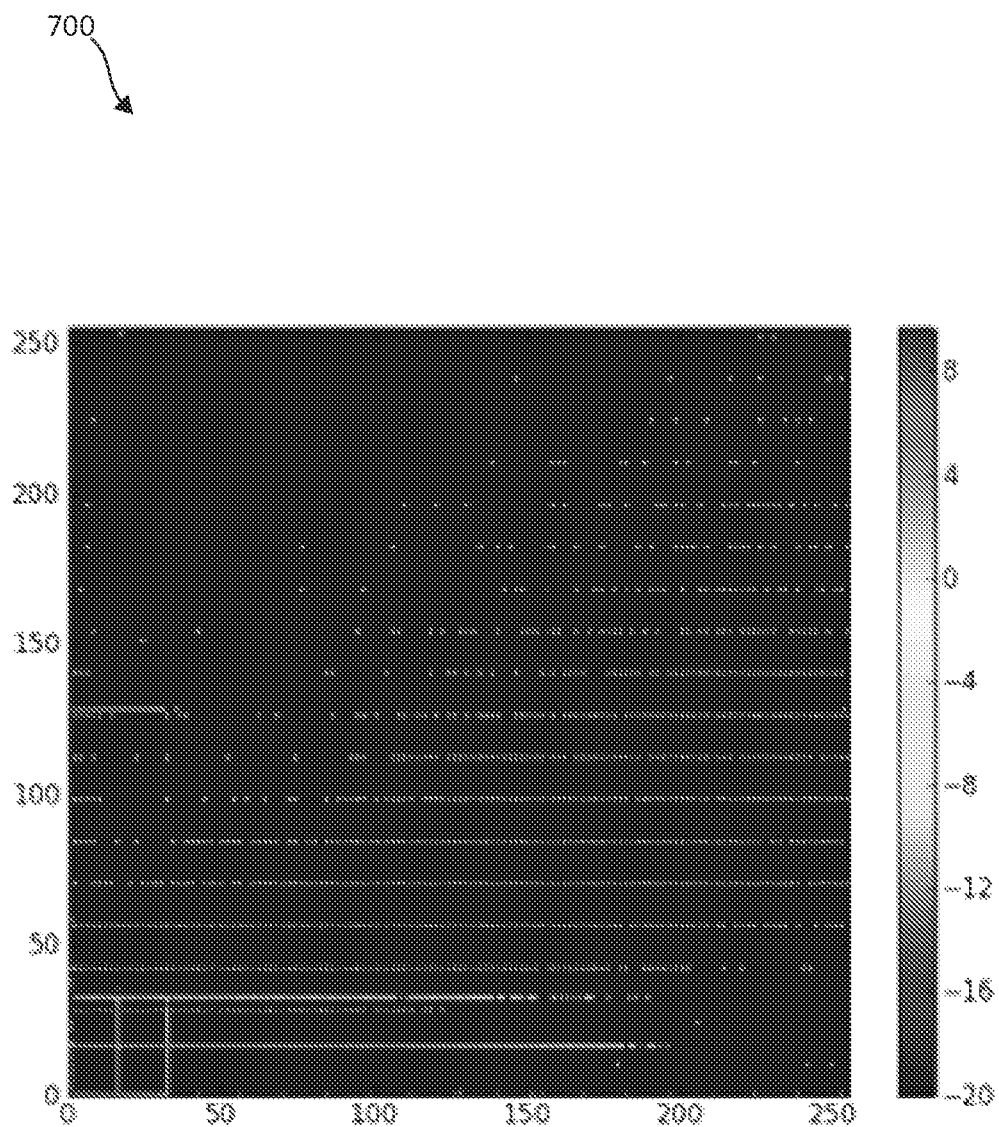
FIG. 7 is a block diagram illustrating exemplary identified data ranges for splitting serialized B-Tree data in which aspects of the present invention may be realized.

In one embodiment, for each serialized B-Tree, the present invention identifies data ranges on bit level by 1) detecting data segments for better/increasing compression (e.g., increasing compression, such as increasing the compression ratio for improving compression efficiency) of heterogeneous data files, detecting an order of contexts, detecting a size of all range records, and reorders a memory block for a specific size of a range record. FIG. 7 is a block diagram 700 illustrating exemplary identified data ranges for splitting serialized B-Tree data in which aspects of the present invention may be realized. In one embodiment, the serialized B-Tree data is split in accordance with the various identified data ranges (e.g., 0 to 250). In other words, as illustrated in FIG. 7, 0-256 (horizontal axis) represents possible ASCII character. On the vertical axis, the 8 through negative 20 (−20) are listed and the 8-20 refers to the colors in the illustration which means 8 (lighter color) is a hot spot meaning a range with a lot of pairs found, and the −20 (darker color) means a zone with no distribution pair characters found in the sample stream. Using a block sorting operation, the serialized B-Tree data is sorted into the identified data ranges using a data block-sorting operation by using a non-unique sort order based on a limited number of comparisons of data values in a source data block, using a unique sort order of the data values based on a position of the data values in the source data block is detected, and/or restoring the source data block from the unique sort order.

FIG. 8 is a block diagram illustrating exemplary encoding of each identified data range with frequency encoding in which aspects of the present invention may be realized. As illustrated in FIG. 8, each of the identified data ranges is encoded with frequency encoding. The first value in the frequency encoded range is the same as the first value in the original data. For example, the first value of the original buffer range (17) is moved as the first value in the frequency encoded range (17). All the following values in the encoded range are equal to the difference (delta) between the corresponding value in the input file, and the previous value in the input file. For example, the second value in the original buffer range (19) is subtracted from the first value in the original buffer range (17) and the result is 2. The value of 2 is now the second value of the frequency encoded buffer. Further illustrating this point, the third value in the original buffer range (24) is subtracted from the second value in the original buffer range (19) and the result is 5. The value of 5 is now the second value of the frequency encoded buffer. This process continues for all the following values in the encoded range.

In one embodiment, the present invention compresses each of the identified data ranges using deflate. In one embodiment, the present invention packages all compressed identified data ranges into an output buffer.

Figure 9:
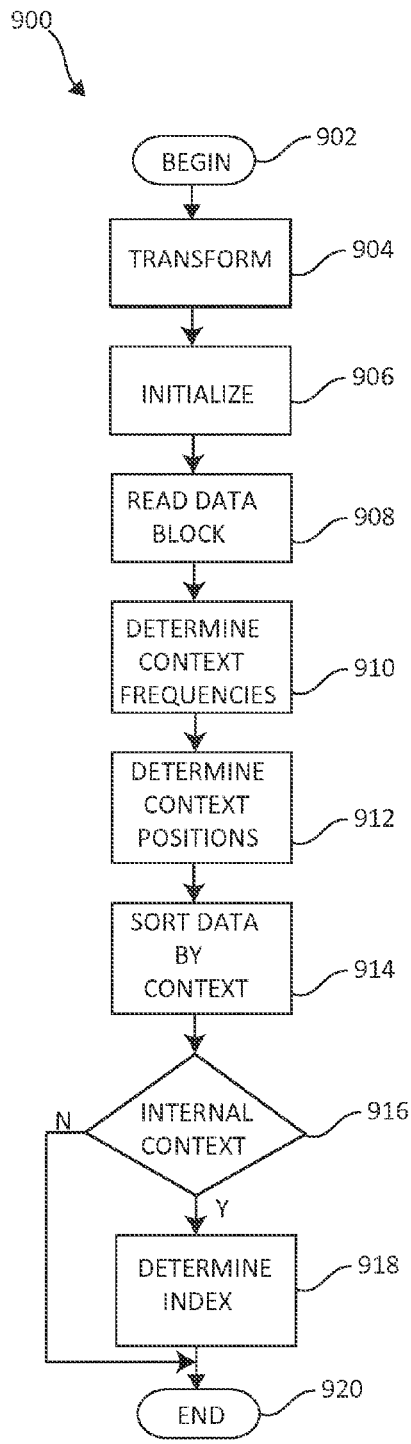
FIG. 9 is a flowchart illustrating an exemplary method for sorting serialized B-Tree data per identified data ranges in a computing environment in which aspects of the present invention may be realized is illustrated.

FIG. 9 is a flowchart illustrating an exemplary method for sorting serialized B-Tree data per identified data ranges in a computing environment in which aspects of the present invention may be realized is illustrated. The method 900 begins the process of serialized B-Tree compression (step 902) by calling the compression transform object to initialize the compression object (step 904). The method 900 initialized the serialized B-Tree data process (step 906). The method 900 reads a data block (e.g., the serialized B-Tree data block) (step 908). (At this point, steps 910-914 refer to the process of identifying data ranges on data: detects the order of contexts, detects the range records size, and reorders a memory block for a specific size of record). The method 900 determines context frequencies (step 910). The method 900 determines context positions (step 912). The method 900 sorts the serialized B-Tree data by context (step 914). (At this point, steps 916-918 refer to internal processing for compressing reordered data, if any). The method 900 determines if the context is internal (step 916). If yes, the method 900 determines an index of the serialized B-Tree data (step 918). If no, the method 900 ends (step 920).

Figure 10:
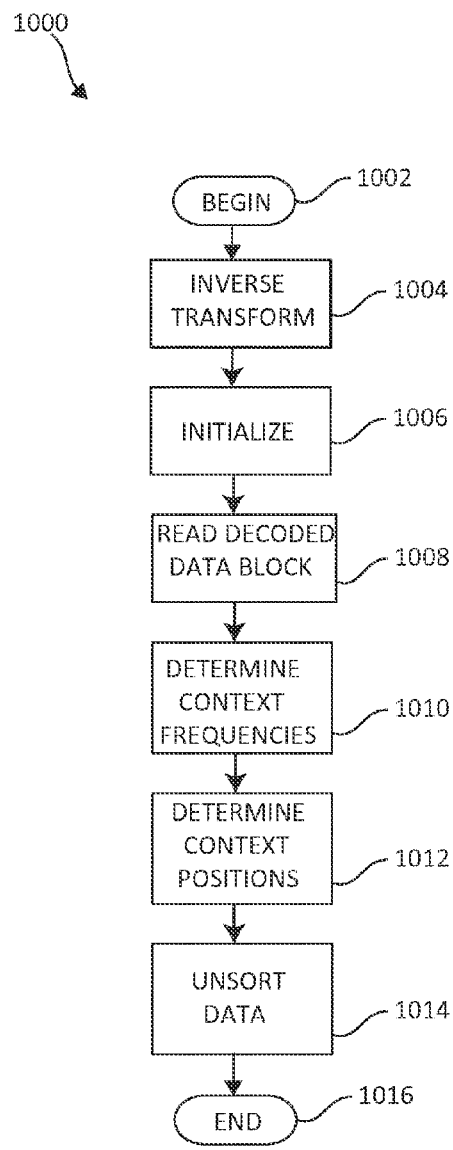
FIG. 10 is a flowchart illustrating an exemplary method for unsorting serialized B-Tree data per identified data ranges in a computing environment in which aspects of the present invention may be realized is illustrated.

FIG. 10 is a flowchart illustrating an exemplary method for unsorting serialized B-Tree data per identified data ranges in a computing environment in which aspects of the present invention may be realized is illustrated. (Steps 1002-1016 represent the inverse operation and match FIG. 9 just as the inverse operation is performed). The method 1000 begins (step 1002) by calling the inverse compression transform object to initialize the compression object (step 1004). The method 1000 initialized the serialized B-Tree data process (step 1006). The method 1000 reads a decoded data block (e.g., the decoded serialized B-Tree data block) (step 1008). (Steps 1010-1012 illustrate, in the decoded data, determining the context frequency plus the position the decoded data might be in just by reading the position from the header and/or by actually identifying the position in the decoded data by scanning the sorted data). The method 1000 determines context frequencies (step 1010). The method 1000 determines context positions (step 1012). The method 1000 unsorts the serialized B-Tree data by context (step 1014). The method 1000 ends (step 1016).

In one embodiment, the present invention provides for efficient B-Tree data serialization using a processor device in a computing environment, or in other words, providing efficient serialization of B-tree data to existing data on any type of workload. In one embodiment, by way of example only, B-Tree data is serialized to existing data for all types of workloads by converting a B-Tree data structure into a format capable of being stored and resurrected while containing all data stored in the B-Tree data structure and information relating to the B-Tree data structure. The serialized B-Tree data is divided into multiple sections, which include at least a B-Tree information section, a B-Tree key section, and a B-Tree data section.

In one embodiment, the present invention stores the serialized B-Tree data into one or more buffers (e.g., binary buffers). The B-Tree information section is stored in a first binary buffer, the B-Tree key section is stored in a second binary buffer, and the B-Tree data section is stored in a third binary buffer.

In one embodiment, the present invention saves information describing the B-Tree data structure in the B-Tree information section, which includes at least sizes and amounts of elements in the B-Tree data structure. In one embodiment, the present invention uses the B-Tree information section for calculating memory required for the B-Tree data structure when deserializing the B-Tree data.

In one embodiment, the present invention saves the keys used in the B-Tree data structure in the B-Tree key section. The keys are ordered according to a tree scan order, and the size of the B-Tree key section is equal to a total number of keys saved in inner nodes plus a total number of keys saved in leaves multiplied by a size of one of the plurality of keys.

In one embodiment, the present invention saves, in the B-Tree data section, B-Tree data elements stored in the B-Tree data structure. The size of the B-Tree data section is equal to a total number of the B-Tree data elements in the B-Tree data structure multiplied by a size of each of the B-Tree data elements.

In one embodiment, the present invention provides for compression of serialized B-Tree data using a processor device in a computing environment. In one embodiment, by way of example only, the present invention compresses serialized B-Tree data that has been split, sorted and classified into identified data ranges. The present invention identifies the identified data ranges on a bit level by performing at least one of detecting data segments for better/increasing compression of heterogeneous data files, detecting an order of contexts, detecting a size of all range records, and/or reorders a memory block for a specific size of a range record. The serialized B-Tree data is sorted into the identified data ranges using a data block-sorting operation by performing at least one of using a non-unique sort order based on a limited number of comparisons of data values in a source data block, using a unique sort order of the data values based on a position of the data values in the source data block is detected, and/or restoring the source data block from the unique sort order.

In one embodiment, the present invention encodes each of the identified data ranges with frequency encoding, wherein a first value in a frequency encoded identified data range is a first value in original data and all subsequent values in the frequency encoded identified data range are equal to a difference between a corresponding value in an input file and a previous value in the input file.

In one embodiment, the present invention classifies serialized B-Tree data into one of a plurality of classes (e.g., identified frequency ranges) for grouping the serialized B-Tree data into compression streams associated with each one of the identified frequency ranges, wherein the compression streams are encoded based on a frequency-specific optimized encoding operation, and combining the compression streams into one output buffer, wherein the compression streams are extracted.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium (e.g., a non-transitory computer readable storage medium). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

What is claimed is:

1. A method for compression of serialized B-Tree data using a processor device in a computing environment, comprising:
   compressing the serialized B-Tree data that has been split, sorted and classified into identified data ranges; and
   encoding each of the identified data ranges with frequency encoding, wherein a first value in a frequency encoded identified data range is a first value in original data and all subsequent values in the frequency encoded identified data range are equal to a difference between a corresponding value in an input file and a previous value in the input file.

2. The method of claim 1, further including identifying the identified data ranges on a bit level by performing at least one of:
   detecting data segments for increasing compression of heterogeneous data files,
   detecting an order of contexts,
   detecting a size of all range records, and
   reordering a memory block for a specific size of a range record.

3. The method of claim 1, further including sorting the serialized B-Tree data into the identified data ranges using a data block-sorting operation by performing at least one of:
   using a non-unique sort order based on a limited number of comparisons of data values in a source data block,
   using a unique sort order of the data values based on a position of the data values in the source data block is detected, and
   restoring the source data block from the unique sort order.

4. The method of claim 1, further including compressing each of the identified data ranges using deflate.

5. The method of claim 1, further including packing all compressed identified data ranges into an output buffer.

6. The method of claim 1, further including performing one of:

serializing B-Tree data to existing data for one of a plurality of workloads by converting a B-Tree data structure into a format capable of being stored and resurrected while containing all data stored in the B-Tree data structure and information relating to the B-Tree data structure, and dividing the serialized B-Tree data into a plurality of sections, wherein the plurality of sections include at least one of a B-Tree information section, a B-Tree key section, and a B-Tree data section.

7. A system for compression of serialized B-Tree data using a processor device in a computing environment, the system comprising:

at least one processor device operable in the computing storage environment for controlling the compression of the serialized B-Tree data, wherein the at least one processor device:

compresses the serialized B-Tree data that has been split, sorted and classified into identified data ranges, and encodes each of the identified data ranges with frequency encoding, wherein a first value in a frequency encoded identified data range is a first value in original data and all subsequent values in the frequency encoded identified data range are equal to a difference between a corresponding value in an input file and a previous value in the input file.

8. The system of claim 7, wherein the at least one processor device identifies the identified data ranges on a bit level by performing at least one of:

detecting data segments for increasing compression of heterogeneous data files, detecting an order of contexts, detecting a size of all range records, and reordering a memory block for a specific size of a range record.

9. The system of claim 7, wherein the at least one processor device sorts the serialized B-Tree data into the identified data ranges using a data block-sorting operation by performing at least one of:

using a non-unique sort order based on a limited number of comparisons of data values in a source data block, using a unique sort order of the data values based on a position of the data values in the source data block is detected, and restoring the source data block from the unique sort order.

10. The system of claim 7, wherein the at least one processor device compresses each of the identified data ranges using deflate.

11. The system of claim 7, wherein the at least one processor device packs all compressed identified data ranges into an output buffer.

12. The system of claim 7, wherein the at least one processor device performs one of:

serializing B-Tree data to existing data for one of a plurality of workloads by converting a B-Tree data structure into a format capable of being stored and resurrected while containing all data stored in the B-Tree data structure and information relating to the B-Tree data structure, and dividing the serialized B-Tree data into a plurality of sections, wherein the plurality of sections include at least one of a B-Tree information section, a B-Tree key section, and a B-Tree data section.

13. A computer program product for compression of serialized B-Tree data using a processor device using a processor device in a computing environment, the computer program product comprising a non-transitory computer-readable storage medium having computer-readable program code portions stored therein, the computer-readable program code portions comprising:

a first executable portion that compresses the serialized B-Tree data that has been split, sorted and classified into identified data ranges; and encodes each of the identified data ranges with frequency encoding, wherein a first value in a frequency encoded identified data range is a first value in original data and all subsequent values in the frequency encoded identified data range are equal to a difference between a corresponding value in an input file and a previous value in the input file.

14. The computer program product of claim 13, further including a second executable portion that identifies the identified data ranges on a bit level by performing at least one of:

detecting data segments for increasing compression of heterogeneous data files, detecting an order of contexts, detecting a size of all range records, and reordering a memory block for a specific size of a range record.

15. The computer program product of claim 13, further including a second executable portion that sorts the serialized B-Tree data into the identified data ranges using a data block-sorting operation by performing at least one of:

using a non-unique sort order based on a limited number of comparisons of data values in a source data block, using a unique sort order of the data values based on a position of the data values in the source data block is detected, and restoring the source data block from the unique sort order.

16. The computer program product of claim 13, further including a second executable portion that:

compresses each of the identified data ranges using deflate, and packs all compressed identified data ranges into an output buffer.

17. The computer program product of claim 13, further including a second executable portion that performs one of:

serializing B-Tree data to existing data for one of a plurality of workloads by converting a B-Tree data structure into a format capable of being stored and resurrected while containing all data stored in the B-Tree data structure and information relating to the B-Tree data structure, and dividing the serialized B-Tree data into a plurality of sections, wherein the plurality of sections include at least one of a B-Tree information section, a B-Tree key section, and a B-Tree data section.

* * * * *